(12) United States Patent
Tang

(10) Patent No.: US 9,940,963 B1
(45) Date of Patent: Apr. 10, 2018

(54) MAGNETIC MEDIA WITH ATOM IMPLANTED MAGNETIC LAYER

(71) Applicant: Western Digital Technologies, Inc., Irvine, CA (US)

(72) Inventor: Kai Tang, San Jose, CA (US)

(73) Assignee: WESTERN DIGITAL TECHNOLOGIES, INC., Irvine, CA (US)

(*) Notice: Subject to any disclaimer, the term of this patent is extended or adjusted under 35 U.S.C. 154(b) by 0 days.

(21) Appl. No.: 15/354,980

(22) Filed: Nov. 17, 2016

(51) Int. Cl.
| | |
|---|---|
| *G11B 5/708* | (2006.01) |
| *G11B 5/84* | (2006.01) |
| *G11B 5/712* | (2006.01) |
| *G11B 5/72* | (2006.01) |
| *G11B 5/65* | (2006.01) |
| *C23C 14/48* | (2006.01) |
| *G11B 5/82* | (2006.01) |

(52) U.S. Cl.
CPC .............. *G11B 5/708* (2013.01); *C23C 14/48* (2013.01); *G11B 5/65* (2013.01); *G11B 5/712* (2013.01); *G11B 5/72* (2013.01); *G11B 5/84* (2013.01); *G11B 5/8408* (2013.01); *G11B 5/82* (2013.01)

(58) Field of Classification Search
None
See application file for complete search history.

(56) References Cited

U.S. PATENT DOCUMENTS

| | | | |
|---|---|---|---|
| 5,815,343 A | 9/1998 | Ishikawa et al. | |
| 6,046,100 A | 4/2000 | Ramaswami et al. | |
| 6,095,160 A | 8/2000 | Chu | |
| 6,103,367 A | 8/2000 | Weir et al. | |
| 6,177,175 B1 | 1/2001 | Hashimoto | |
| 6,210,819 B1 | 4/2001 | Lal et al. | |
| 6,316,062 B1 | 11/2001 | Sakaguchi et al. | |
| 6,753,043 B1 * | 6/2004 | Kuo et al. .............. | G11B 5/855 427/128 |
| 7,060,194 B2 | 6/2006 | Kodaira et al. | |
| 7,586,830 B2 | 9/2009 | Yasui et al. | |

(Continued)

FOREIGN PATENT DOCUMENTS

JP 10-22008827 8/1990

OTHER PUBLICATIONS

Kobayashi, R. et al., "HDI Technology for Perpendicular Magnetic Recording Media," Fuji Electric Review, Issue : Magnetic Recording Media, vol. 57, No. 2, pp. 51-56, 2011.

(Continued)

*Primary Examiner* — Craig A. Renner
(74) *Attorney, Agent, or Firm* — Foley & Lardner LLP

(57) ABSTRACT

A method for manufacturing a magnetic media for magnetic data recording that improves smoothness for reduced magnetic spacing, and also improves mechanical integration to improve reliability and lifespan of the data recording system. A magnetic material such as a magnetic recording layer is deposited over underlying layers that include a substrate. A first etching is performed that employs a Xe plasma. A second etching is then performed that employs an Ar plasma. The two step etching process advantageously improves smoothness of the surface of the magnetic layer which allows for a thinner overcoat for reduced magnetic spacing. The two step etching process also results in less head disk crashes, resulting in improved reliability.

18 Claims, 4 Drawing Sheets

(56) References Cited

U.S. PATENT DOCUMENTS

| | | |
|---|---|---|
| 7,616,404 B2 | 11/2009 | Suwa et al. |
| 7,943,193 B2 | 5/2011 | Endou et al. |
| 8,110,298 B1 | 2/2012 | Choe et al. |
| 8,202,636 B2 | 6/2012 | Choe et al. |
| 8,349,196 B2 | 1/2013 | Fairbairn et al. |
| 8,900,465 B1 | 12/2014 | Yun et al. |
| 9,159,353 B2 | 10/2015 | Mercado et al. |
| 9,183,867 B1 | 11/2015 | Bertero et al. |
| 2001/0028963 A1 | 10/2001 | Naoe et al. |
| 2002/0040848 A1 | 4/2002 | Sakurai et al. |
| 2003/0162057 A1 | 8/2003 | Matsunuma et al. |
| 2004/0161578 A1 | 8/2004 | Chour et al. |
| 2004/0175510 A1 | 9/2004 | Hattori et al. |
| 2004/0264070 A1 | 12/2004 | Lee et al. |
| 2005/0068691 A1 | 3/2005 | Kagami et al. |
| 2005/0068855 A1 | 3/2005 | Morikawa et al. |
| 2005/0181239 A1 | 8/2005 | Ma et al. |
| 2006/0086606 A1 | 4/2006 | Honda et al. |
| 2006/0121724 A1 | 6/2006 | Yue et al. |
| 2007/0087227 A1 | 4/2007 | Ma et al. |
| 2007/0275269 A1 | 11/2007 | Takahoshi et al. |
| 2008/0024041 A1 | 1/2008 | Shibata |
| 2008/0074784 A1 | 3/2008 | Aoyama |
| 2008/0174913 A1 | 7/2008 | Sato |
| 2009/0237838 A1* | 9/2009 | Fukushima et al. .... G11B 5/855 360/110 |
| 2009/0268599 A1 | 10/2009 | Murakami |
| 2009/0323219 A1* | 12/2009 | Fukushima et al. .... G11B 5/855 360/122 |
| 2010/0092802 A1 | 4/2010 | Ma et al. |
| 2010/0190036 A1 | 7/2010 | Komvopoulos et al. |
| 2011/0199700 A1* | 8/2011 | Hirose et al. .......... G11B 5/855 360/55 |
| 2011/0293967 A1 | 12/2011 | Zhang et al. |
| 2012/0012554 A1 | 1/2012 | Bian et al. |
| 2012/0034135 A1 | 2/2012 | Risby |
| 2012/0075740 A1* | 3/2012 | Yasumori et al. ...... G11B 5/855 360/59 |
| 2013/0094109 A1 | 4/2013 | Marchon et al. |
| 2013/0114165 A1 | 5/2013 | Mosendz et al. |
| 2013/0309526 A1 | 11/2013 | Mercado et al. |
| 2014/0065444 A1 | 3/2014 | Rose Dit Rose |
| 2014/0168817 A1 | 6/2014 | Choe et al. |
| 2014/0231385 A1 | 8/2014 | Guo et al. |
| 2015/0302877 A1 | 10/2015 | Tang |

OTHER PUBLICATIONS

Dwivedi, N. et al., "Probing the Role of an Atomically Thin SiNx Interlayer on the Structure of Ultrathin Carbon Films," Nature.com, Scientific Reports, vol. 4, Article 502, 2014, pp. 1-10.

Su, H. C. et al., "A Comparison Between X-ray Reflectivity and Atomic Force Microscopy on the Characterization of a Surface Roughness," Chinese Journal of Physics, vol. 50, No. 2, Apr. 2012, pp. 291-300.

Notice of Allowance from U.S. Appl. No. 13/472,854, dated Jun. 22, 2015.

Non-Final Office Action from U.S. Appl. No. 13/472,854, dated Jan. 27, 2015.

Final Office Action from U.S. Appl. No. 13/472,854, dated Jun. 6, 2014.

Non-Final Office Action from U.S. Appl. No. 13/472,854, dated Dec. 31, 2013.

Non-Final Office Action from U.S. Appl. No. 14/695,858, dated Jul. 14, 2016.

Final Office Action from U.S. Appl. No. 14/695,858, dated Apr. 6, 2016.

Non-Final Office Action from U.S. Appl. No. 14/695,858, dated Sep. 25, 2015.

Restriction Requirement from U.S. Appl. No. 13/472,854, dated Oct. 2, 2013.

Dwivedi, N. et al., "Understanding the Role of Nitrogen in Plasma-Assisted Surface Modification of Magnetic Recording Media with and without Ultrathin Carbon Overcoats," Nature.com, Scientific Reports, vol. 5, Article No. 7772, Jan. 14, 2015, pp. 1-13.

Kainuma, K. et al., "Aluminum Substrate for 3.5-inch 1 TB Magnetic Recording Media," Fuji Electric Review, Issue : Magnetic Recording Media, vol. 57, No. 2, pp. 62-66, 2011.

* cited by examiner

MAGNETIC MEDIA WITH ATOM IMPLANTED MAGNETIC LAYER

FIELD OF THE INVENTION

The present invention relates to magnetic data recording, and more particularly to a perpendicular magnetic media fabricated using a two step etching process that provides improved surface roughness properties for improved performance and reliability.

RELATED APPLICATIONS

The present patent application is related to commonly assigned U.S. Patent Application Publication Number US 2015/0302877 filed Apr. 24, 2015, published Oct. 22, 2015, and also to commonly assigned U.S. Pat. No. 9,159,353, both of which are incorporated herein by reference.

BACKGROUND

At the heart of many computer systems is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the reading and writing functions.

The write head includes at least one coil, a write pole and one or more return poles. When current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic media, thereby recording a bit of data. The write field then travels through a magnetically soft under-layer of the magnetic medium to return to the return pole of the write head.

A magnetoresistive sensor such as a Giant Magnetoresistive (GMR) sensor, a Tunnel Junction Magnetoresistive (TMR) sensor or a scissor type magnetoresistive sensor can be employed to read a magnetic signal from the magnetic media. The magnetoresistive sensor has an electrical resistance that changes in response to an external magnetic field. This change in electrical resistance can be detected by processing circuitry in order to read magnetic data from the magnetic media.

The magnetic media can be a perpendicular magnetic recording media that can include a magnetic recording layer that has an easy axis of magnetization oriented substantially perpendicular to the substrate. Hexagonal Close Packed (HCP) Co-alloys can be used as the magnetic recording layer for such perpendicular magnetic recording. The easy axis of magnetization for these materials lies along the c-axis or [0001] direction.

A perpendicular magnetic recording media is generally formed on a substrate with a soft magnetic under-layer (SUL), one or more inter-layers, and a perpendicular magnetic recording layer, and may include a cap layer exchange coupled with the magnetic recording layer. The soft magnetic under-layer (SUL) serves to concentrate a magnetic flux emitted from a main magnetic pole of the magnetic write head during recording on the magnetic recording layer. The inter-layers (also referred to as seed layers) serve to control the size of magnetic crystal grains and the orientation of the magnetic crystal grains in the magnetic recording layer. The inter-layers also serve to magnetically de-couple the magnetically soft under-layer and the magnetic recording layer. The magnetic recording layer is the layer in which a bit of data is stored based on the orientation of the magnetization of individual magnetic grains.

Because the magnetic recording layer has a magnetization that is oriented parallel to magnetic fields used to write to the media, reversing the magnetization of the magnetic recording layer may be difficult. To assist in reversing the magnetization of the magnetic grains in the magnetic recording layer, the magnetic media may also include a cap layer that is exchange coupled to the magnetic recording layer. The cap layer is typically formed from a CoPt alloy such as CoPt, CoPtCr, CoPtCrB, etc. The cap layer may directly contact the magnetic recording layer, or a coupling layer may be fabricated between the cap layer and the magnetic recording layer. When a coupling layer is used, the structure is sometimes referred to as an exchange spring structure.

As the areal bit density of a magnetic recording media increases, the magnetic regions in the magnetic recording layer become smaller. This may reduce the read signal generated in a read head of the magnetic recording system. One solution to improve the read signal is to reduce the thickness of the carbon overcoat that is typically applied over the cap layer. The carbon overcoat is a non-magnetic layer applied to the top of the cap layer to protect the media from corrosion and/or damage. Reducing the thickness of the carbon overcoat reduces the relative distance between the read head and the cap layer. However, as the carbon overcoat becomes thinner, the corrosion resistance of the disk may degrade, especially if the overcoat is rough.

Another solution for improving the read signal is to reduce the clearance between the read head and the top surface of the disk. However, one consequence of a reduced clearance is head-to-disk contact, which is undesirable. Head-to-disk contact occurs when the slider on which the read and write heads are formed makes contact with the disk. Head-to-disk contact can cause damage to the slider, the disk or both. It therefore, remains an ongoing challenge to improve the performance of the magnetic media.

SUMMARY

One embodiment of the present invention provides a method for manufacturing a magnetic media having a substrate and a layer deposited over the substrate. A first etching is performed, the first etching being a Xe etching. In addition a second etching is performed that is an Ar etching.

The deposited layer can be a magnetic recording layer comprised of multiple layers including a cap layer formed over and exchange coupled to the other layers of the magnetic media. The novel two-step etching process advantageously provides a very smooth surface, allowing deposition of a thinner overcoat layer there-over. This improves performance by minimizing the magnetic spacing.

The novel two-step etching process also advantageously improves mechanical integration, preventing head/disk contact and improving reliability. The use of the two different etching processes provides a synergistic improvement in performance and reliability that cannot be achieved by a single step etching process by either Xe or Ar.

The first and second etchings can be performed in a chamber with the substrate and deposited layer being held on a chuck. A DC bias can be applied to the substrate and deposited layer so as to attract ions toward the deposited layer. A plasma can be excited in the chamber to allow the etching to be performed.

In one embodiment, the two-step etching results in ion implantation in the surface of the deposited layer. In this process all or most of Xe atoms implanted during the first Xe etching step are removed from the surface of the deposited layer during the second Ar etching step. The smoothness of the interface between the deposited layer and the overcoat and the presence of these ions provides evidence that the novel two-step etching process has been performed in the manufacture of the magnetic media.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
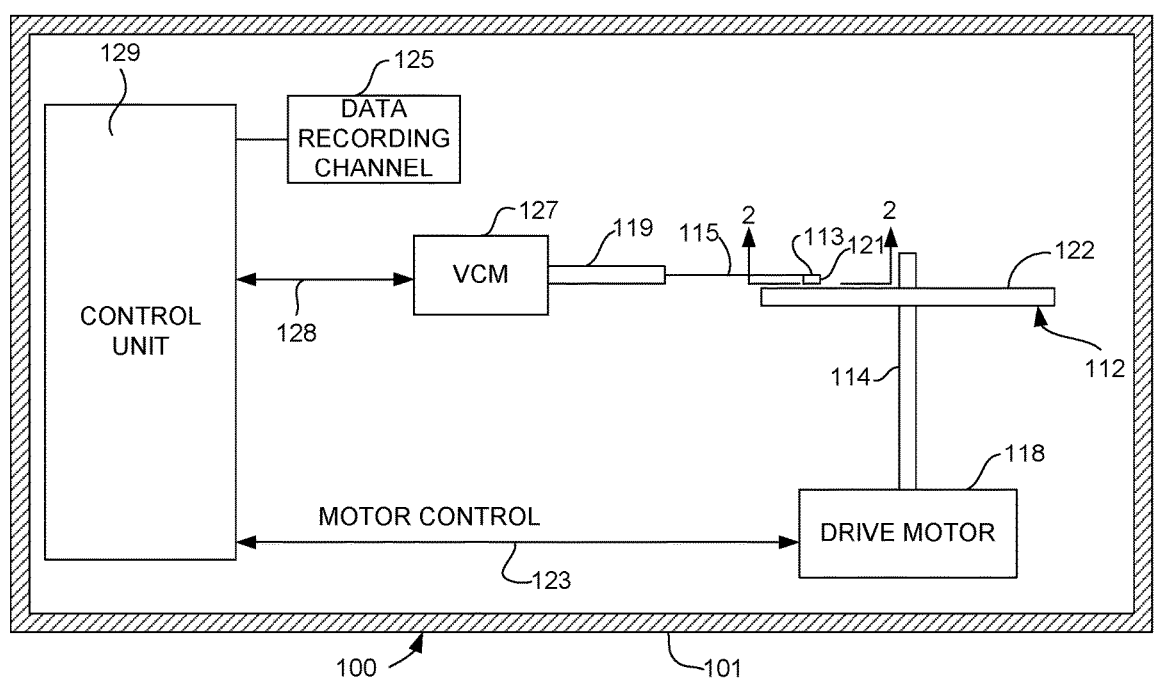
FIG. 1 is a schematic illustration of a disk drive system in which the invention might be embodied.

Referring now to FIG. 1, there is shown a disk drive/data storage system 100. The disk drive 100 includes a housing 101. At least one rotatable magnetic disk 112 is supported on a spindle 114 and rotated by a disk drive motor 118. The magnetic recording on each disk may be in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases the slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by the control unit 129.

During operation of the disk storage system, the rotation of the magnetic disk 112 generates an air bearing between the slider 113 and the disk surface 122, which exerts an upward force or lift on the slider. The air bearing thus counter-balances the slight spring force of the suspension 115 and supports the slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, and a microprocessor. The control unit 129 generates control signals to control various system operations such as drive motor control signals on line 123 and head position and seek control signals on line 128. The control signals on line 128 provide the desired current profiles to optimally move and position the slider 113 to the desired data track on the media 112. Write and read signals are communicated to and from write and read heads 121 by way of recording channel 125.

Figure 2:
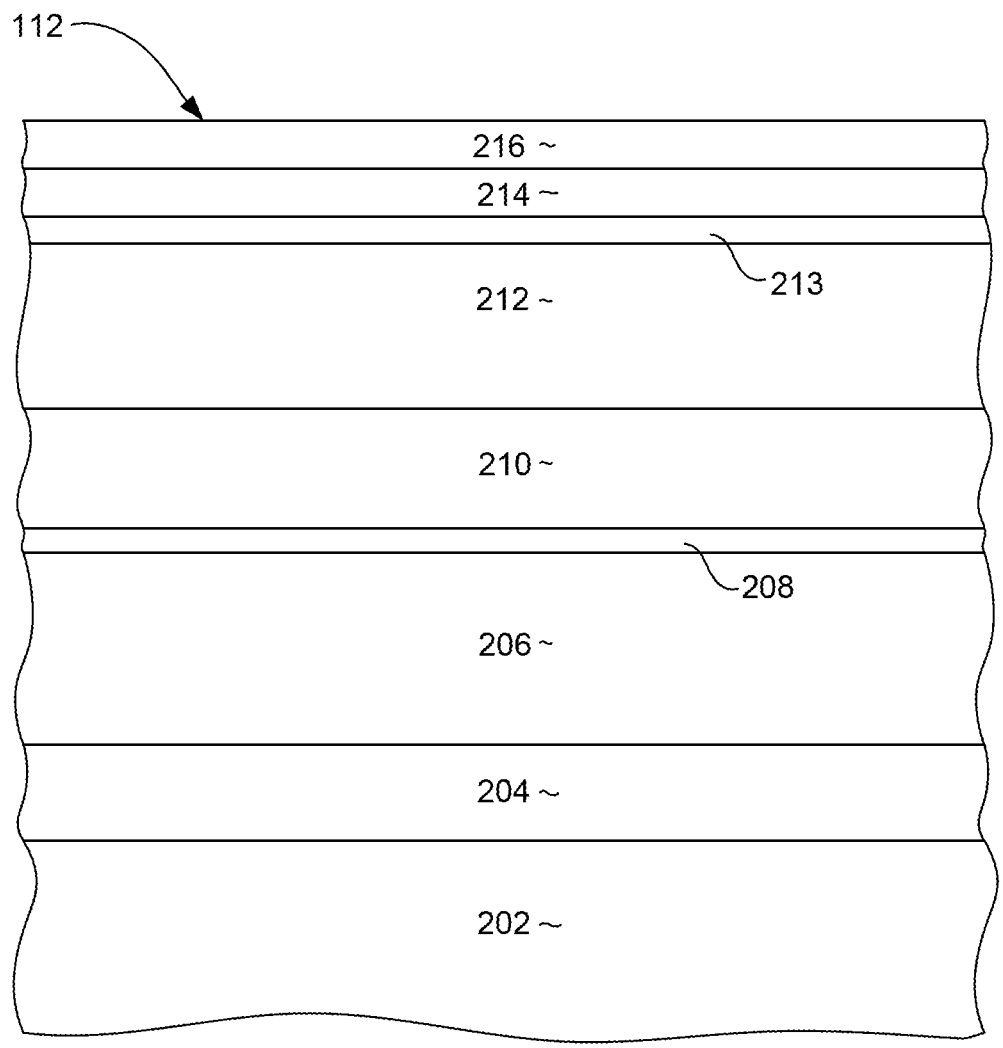
FIG. 2 is a side, cross-sectional view of a portion of a magnetic media, according to one or more embodiments.

FIG. 2 shows cross sectional view of a portion of a magnetic media 112 according to one or more embodiments, such as might be used in a data recording system described above with reference to FIG. 1. The magnetic media 112 includes a substrate 202, such as a glass or ceramic substrate material. An adhesion layer 204 can be formed over the substrate to ensure good adhesion of the above media layers to the substrate 202.

A soft magnetic under-layer 206 can be formed over the adhesion layer 204. The soft magnetic layer 206 can be a magnetic material having a low magnetic coercivity and low anisotropy field (Hk). The soft magnetic under-layer 206 provides a return path for the magnetic field from the write head (not shown). A seed layer 208 can be formed over the soft magnetic under-layer 206. The seed layer 208 can be a material such as Ni and helps to initiate a desired crystalline structure in the above applied layers. An intermediate layer 210 can be formed over the seed layer 208. The intermediate layer 210 can be formed of a non-magnetic material and is preferably constructed of Ru.

A magnetic recording layer 212, which may include a capping layer 213, is formed over the intermediate layer 210. The intermediate layer helps to magnetically decouple the magnetic recording layer 212 from the soft magnetic under-layer 206. The magnetic recording layer has a structure such that it can be magnetized in a direction perpendicular to the plane of the layers by a magnetic field from a magnetic write head (not shown), and this magnetization can remain fixed and stable until it is written to again at a later time by a magnetic field from the write head. In order to protect the magnetic recording layer 212 from wear and corrosion, an overcoat layer 214 can be formed over the magnetic recording layer 212. The overcoat 214 can be a physically hard material such as carbon, and a lubricant layer 216 can be formed over the overcoat layer 214.

In order to maximize magnetic performance, it is desirable that the overcoat layer 214 be as thin as possible while still maintaining reliability. The thinner the carbon overcoat 214 is, the smaller the spacing between head (not shown in FIG. 2) and magnetic recording layer 212 will be. This reduced spacing increases the strength of the signal read by the read head and also increases the effective strength of the write signal provided by the write head to the magnetic recording layer 212. However, the protective overcoat also needs to be sufficiently thick to maintain reliability by preventing corrosion and damage to the magnetic recording layer 212.

Optimizing the surface smoothness of the recording layer 212 can greatly improve the ability to minimize the thickness of the overcoat 214 while also maintaining reliability of the disk drive system by preventing corrosion of or damage to the magnetic recording layer 212. A smoother surface of the magnetic recording layer 212 allows the overcoat layer 214 to be smoother as well and prevents head disk contact (crashes).

Surface properties of the magnetic recording layer can be greatly improved through a two step etching process, whereby the surface of the magnetic recording layer 212 is etched prior to depositing the overcoat 214. The process involves etching first in a Xe atmosphere and then with an Ar atmosphere. This process can be better understood with reference to FIG. 3.

Figure 3:
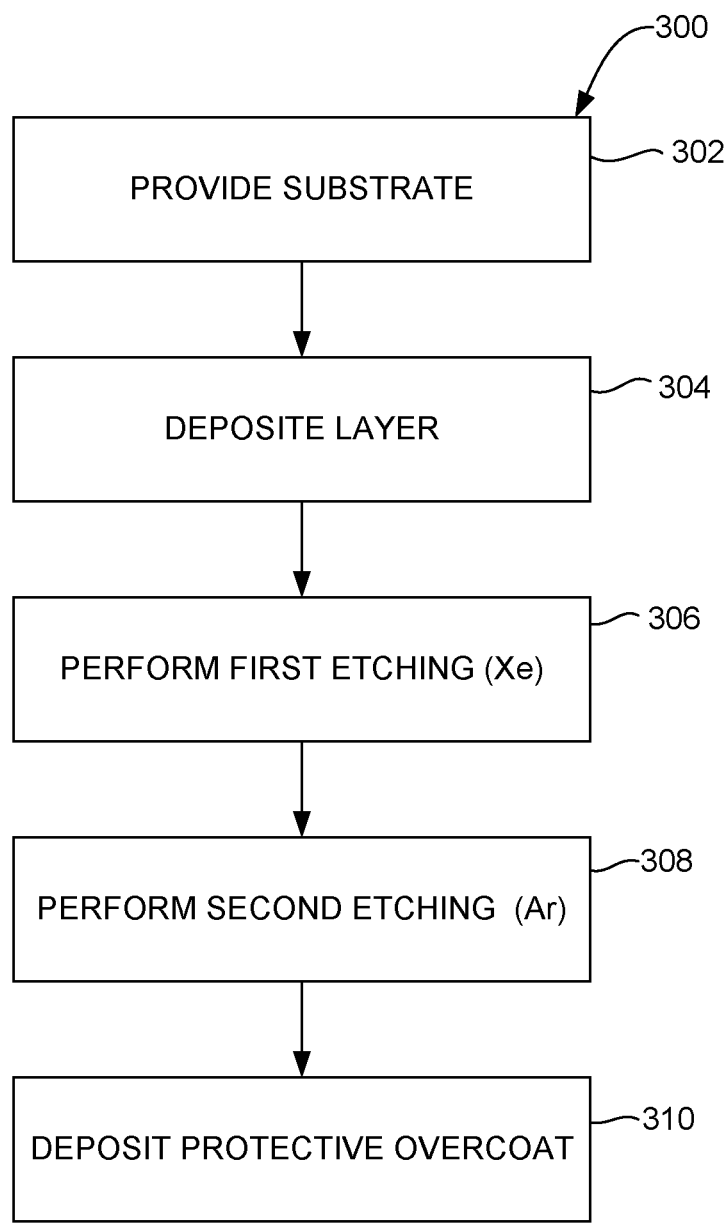
FIG. 3 is a flowchart illustrating a method for manufacturing a magnetic media, according to one or more embodiments.

FIG. 3 is a flowchart summarizing a process 300 for manufacturing a magnetic media for magnetic data recording. The flowchart summarizes the process according to various embodiments. In certain embodiments, certain depicted steps may be omitted, altered or combined, or additional steps may be performed in addition to the ones shown, according to the variations described throughout this disclosure. In a step, 302 a substrate is provided. The substrate can be the substrate 202 of FIG. 2, or some structure on which layers can be deposited.

Then, in a step 304 one or more layers are deposited over the substrate. These deposited layers can be, for example, the layers 204, 206, 208, 210, 212 of FIG. 2. This is by way of example, as more or less or different layers can be deposited over the substrate to form layers of a magnetic media of various structure or configurations. In the present example, the deposited layer includes a magnetic recording layer 212 and may include the cap layer 213 that is exchange coupled to the magnetic recording layer at the top of the layer 212.

Then, in a step 306 a first etching is performed. This etching is preferably a plasma etching performed in an atmosphere that contains Xe. The substrate and the layer deposited there-over are placed in a chamber and held on a chuck. A DC bias can be applied to the chuck so as to attract ions toward the layer deposited over the substrate. Xe gas is entered into the chamber and excited to form a plasma. As ions from the plasma strike the surface of the deposited layer, they smoothen the surface. Xe etching can produce a very smooth surface on the deposited layer. Preferably, the Xe etching results in a roughness on the surface of the deposited layer that is less than 4.7 Angstroms measured by the X-ray reflectivity technique.

With continued reference to FIG. 3, in a step 308 a second etching is performed. This second etching is an Ar etching. Again, the substrate and the deposited layer are placed in a chamber on a chuck to which a DC bias voltage can be applied in order to attract ions toward the deposited layer. In this case, Ar gas is entered into the chamber and a plasma is again struck. The Ar plasma further affects the surface of the deposited film to improve reliability and performance of the magnetic media and magnetic disk drive system. It has been found that, while Xe etching forms a smoother surface than does Ar etching, Ar etching improves mechanical integration as compared with Xe etching. Ar etching has excellent properties for forming a surface that prevents head disk contact and related damage. Taken together, the combination of Xe etching followed by Ar etching provides a synergistic improvement in performance and reliability that is greater than the use of either one of these etching techniques and that is greater than the sum of the etching techniques.

In a step 310, after performing the first and second etching steps 306, 308, a protective overcoat material can be deposited. This overcoat can be a material such as carbon, and serves to provide a protective film over the previously deposited and etched layer. Because of the smooth surface provided by the previous etching processes, the overcoat can be deposited thin, such as 20 to 28 Angstroms.

The first and second etchings 306, 308 can be performed in a common chamber. Additionally, the deposition of the protective overcoat (step 310) can also be performed in the same chamber. Alternatively, the first and second etchings can be performed in different chambers, which may provide additional smoothening of the surface of the deposited layer.

Figure 4:
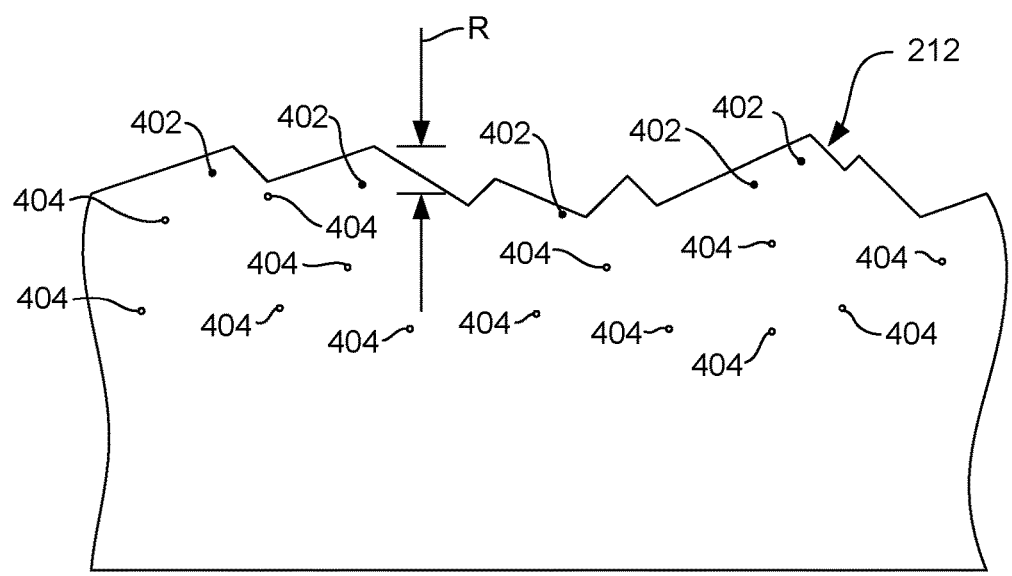
FIG. 4 is an enlarged cross-sectional view of a magnetic media surface, according to one or more embodiments.

FIG. 4 shows a highly magnified cross sectional view of a magnetic recording layer 212 (which may include a cap layer) after the above first and second etching processes 306, 308 (FIG. 3) have been performed. As discussed above, the etching processes 306, 308 result in the surface of the layer 212 having an average peak to valley roughness R of less than 4.7 Angstroms. In addition, as a bi-product of the etching processes 306, 308 some Xe and Ar ions will become implanted into the surface of the layer 212. Implanted Xe ions are represented by solid dots 402, while the implanted Ar ions are represented by open dots 404.

With the Xe etching being performed prior to the Ar etching, the Xe ions will first be implanted. The later performed Ar etching will remove some of the material from the surface of the layer 212 after the Xe etching has been performed. Therefore, the Ar etching will likely remove a substantial portion of the implanted Xe ions 402. However, some portion of Xe implanted ions 402 may remain. Detection of these ions 402, 404 provides evidence that the above described novel two-step etching process has been performed.

Thus, magnetic recording performance can be improved by reducing overcoat thickness and increasing touch-down clearance. While Xe etching alone can provide a very smooth surface on which to apply the overcoat, the use of Xe etching alone presents challenges with regard to mechanical properties. For example, testing has shown that disks polished by Xe etching alone have a higher susceptibility to hydrocarbon and silicon smear as compared with disks polished by Ar etching alone. In component tests, flyability failures were observed for disks polished by Xe etching alone. Ar etching provides a durable mechanical interface between the magnetic head and the media. The use of the above described novel two-step etching process using both Xe and Ar results in optimal properties with regard to smoothness as well as good mechanical integration.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments, but should be defined only in accordance with the following claims and their equivalents.

What is claimed is:

1. A magnetic media for data recording, the magnetic media comprising:

a magnetic layer formed over a substrate; and

Ar and Xe atoms implanted into the magnetic layer, wherein a concentration of the Ar atoms is greater than a concentration of the Xe atoms.

2. The magnetic media as in claim 1 wherein the magnetic layer comprises a magnetic recording layer and a cap layer exchange coupled to the magnetic recording layer.

3. The magnetic media as in claim 1 further comprising a protective overcoat layer formed over the magnetic layer.

4. The magnetic media as in claim 3 wherein the protective overcoat layer comprises carbon.

5. The magnetic media as in claim 1, wherein a surface of the magnetic layer has an average peak to valley roughness of less than 4.7 Angstroms.

6. A magnetic data storage system, comprising:
a housing;
a magnetic media held within the housing;
a slider; and
an actuator for moving the slider relative to a surface of the magnetic media, the magnetic media comprising:
a magnetic layer comprising Xe and Ar atoms implanted therein, wherein a concentration of the Ar atoms is greater than a concentration of the Xe atoms.

7. The magnetic data storage system as in claim 6 wherein the magnetic media further comprises a protective overcoat formed over the magnetic layer.

8. A method for manufacturing a magnetic media, the method comprising:
providing a substrate;
depositing a magnetic recording layer over the substrate;
performing a Xe etching process to implant Xe atoms in the magnetic recording layer; and
performing an Ar etching process to implant Ar atoms in the magnetic recording layer, wherein a concentration of the Ar atoms in the magnetic recording layer is greater than a concentration of the Xe atoms in the magnetic recording layer.

9. The method as in claim 1, further comprising, after performing the Ar etching process, depositing a protective overcoat.

10. The method as in claim 9, wherein the protective overcoat comprises carbon.

11. The method as in claim 1, wherein the Xe etching process is performed before the Ar etching process.

12. The method as in claim 8, wherein each of the Xe etching process and the Ar etching process is performed in a chamber with the substrate and the magnetic recording layer held on a chuck with application of a DC bias.

13. The method as in claim 12, wherein the Xe etching process is performed by creating Xe plasma in the chamber and the Ar etching process is performed by creating an Ar plasma in the chamber.

14. The method as in claim 9, wherein the Xe etching process, the Ar etching process, and the deposition of the protective overcoat are all performed in a common chamber.

15. The method as in claim 1, wherein the Xe etching process is performed in a first chamber and the Ar etching process is performed in a second chamber.

16. The method as in claim 1, wherein the Xe etching process comprises:
placing the substrate and the magnetic recording layer into a chamber;
inputting Xe gas into the chamber;
applying a DC voltage to the substrate and the magnetic recording layer; and
exciting a plasma in the chamber.

17. The method as in claim 1, wherein the Ar etching process comprises:
placing the substrate and the magnetic recording layer into a chamber;
inputting Ar gas into the chamber;
applying a DC voltage to the substrate and the magnetic recording layer; and
exciting a plasma in the chamber.

18. The method as in claim 8, wherein the magnetic recording layer is exchange coupled to a cap layer.

* * * * *